US007110555B2

(12) United States Patent
Shiobara

(10) Patent No.: US 7,110,555 B2
(45) Date of Patent: Sep. 19, 2006

(54) SOUND SIGNAL REPRODUCING APPARATUS

(75) Inventor: Hideaki Shiobara, Chiba (JP)

(73) Assignee: Sony Corporation, (JP)

(*) Notice: Subject to any disclaimer, the term of this patent is extended or adjusted under 35 U.S.C. 154(b) by 873 days.

(21) Appl. No.: 10/208,473

(22) Filed: Jul. 30, 2002

(65) Prior Publication Data

US 2003/0031329 A1 Feb. 13, 2003

(30) Foreign Application Priority Data

Aug. 7, 2001 (JP) .......................... P2001-239436

(51) Int. Cl.
*H03G 9/00* (2006.01)
*H03G 7/00* (2006.01)
*H03G 3/00* (2006.01)
*H03F 3/217* (2006.01)
*H03F 3/04* (2006.01)

(52) U.S. Cl. ........................ 381/96; 381/102; 381/106; 381/107; 381/28; 330/251; 330/207 A

(58) Field of Classification Search .................. 381/96, 381/98, 102, 106, 107, 21, 28, 59, 120; 330/207 A, 330/10, 251

See application file for complete search history.

(56) References Cited

U.S. PATENT DOCUMENTS 5,550,925 A * 8/1996 Hori et al. .................... 381/98
5,834,977 A * 11/1998 Maehara et al. ............ 330/297

* cited by examiner

*Primary Examiner*—Vivian Chin
*Assistant Examiner*—Devona E. Faulk
(74) *Attorney, Agent, or Firm*—Lerner, David, Littenberg, Krumholz & Mentlik, LLP

(57) ABSTRACT

A sound signal reproducing apparatus for supplying sound signals of a plurality of channels to speakers via sound amplifier circuits includes: a power supply voltage controller for controlling a power supply voltage to the sound amplifier circuits; a plurality of filter circuits for passing predetermined frequencies of the output signal of each of the sound amplifier circuits in the plurality of channels; a plurality of level detection circuits for detecting levels of output signals of the plurality of filter circuits; an adder circuit for adding output signals of the plurality of level detection circuits; and a comparator circuit for comparing an output signal of the adder circuit with a reference level, so that an output signal of the comparator circuit controls the power supply voltage controller.

14 Claims, 5 Drawing Sheets

SOUND SIGNAL REPRODUCING APPARATUS

BACKGROUND OF THE INVENTION

The present invention relates to a sound signal reproducing apparatus for supplying sound signals for a plurality of channels to speakers via sound amplifier circuits, which apparatus is used in for example a home AV theater system, a multi-channel surround sound system and the like.

Recently, a sound signal reproducing apparatus has been proposed which forms a home AV theater as shown in FIG. 5, for example, and provides a sense of presence in a movie theater, a concert hall or the like by supplying sound signals for a plurality of channels, for example six channels to speakers via sound amplifier circuits.

In FIG. 5, reference numeral 1 denotes a listener; 2FL denotes a front left speaker; 2C denotes a center speaker; 2FR denotes a front right speaker; 2RL denotes a rear left speaker; 2RR denotes a rear right speaker; and 2W denotes a subwoofer.

When the sound signal reproducing apparatus supplying the sound signals for the plurality of channels, for example the six channels to the speakers via the sound amplifier circuits is to ensure that a maximum output of each of the channels is of the same magnitude as in a conventional apparatus, the sound signal reproducing apparatus requires a power supply circuit providing an extremely high power and also requires a cooling device of an extremely large size for cooling a power transistor used in the power supply circuit.

However, the sound signal reproducing apparatus in normal use in an ordinary household does not continuously produce the maximum output in all of the plurality of channels, for example the six channels.

Sound pressure required by the listener 1 is generally constant irrespective of the number of channels. When the listener 1 listens to sound signals of the plurality of channels, for example the six channels, output per channel can be lowered by adjusting the sound volume.

SUMMARY OF THE INVENTION

In view of the above, it is an object of the present invention to make the power supply circuit relatively small and prevent the sound signal reproducing apparatus from breaking down even when a state of a maximum output continues in the plurality of channels, which is not normally expected.

According to the present invention, there is provided a sound signal reproducing apparatus for supplying sound signals for a plurality of channels to speakers via sound amplifier circuits, the sound signal reproducing apparatus includes: the plurality of sound amplifier circuits for amplifying the sound signals inputted thereto and supplying the amplified sound signals to the speakers; a plurality of level detection circuits for detecting level of the output signals of the plurality of sound amplifier circuits; an adder circuit for adding together output signals of the plurality of level detection circuits; and power supply voltage control means for controlling power supply voltage supplied to the sound amplifier circuits on the basis of an output signal of the adder circuit.

According to the present invention, the level of the output signals of the sound amplifier circuits in the plurality of channels is detected, and the power supply voltage to the sound amplifier circuits is controlled by the output signal obtained by adding together the plurality of detection signals resulting from the detection. Therefore, the power supply voltage to the sound amplifier circuits is limited even when a state of a maximum output continues in the plurality of channels, which is not normally expected, and the sound signal reproducing apparatus does not break down even when a power supply circuit is made relatively small in size.

DETAILED DESCRIPTION OF PREFERRED EMBODIMENTS

A preferred embodiment of a sound signal reproducing apparatus according to the present invention will hereinafter be described with reference to FIGS. 1 to 3.

Figure 1:
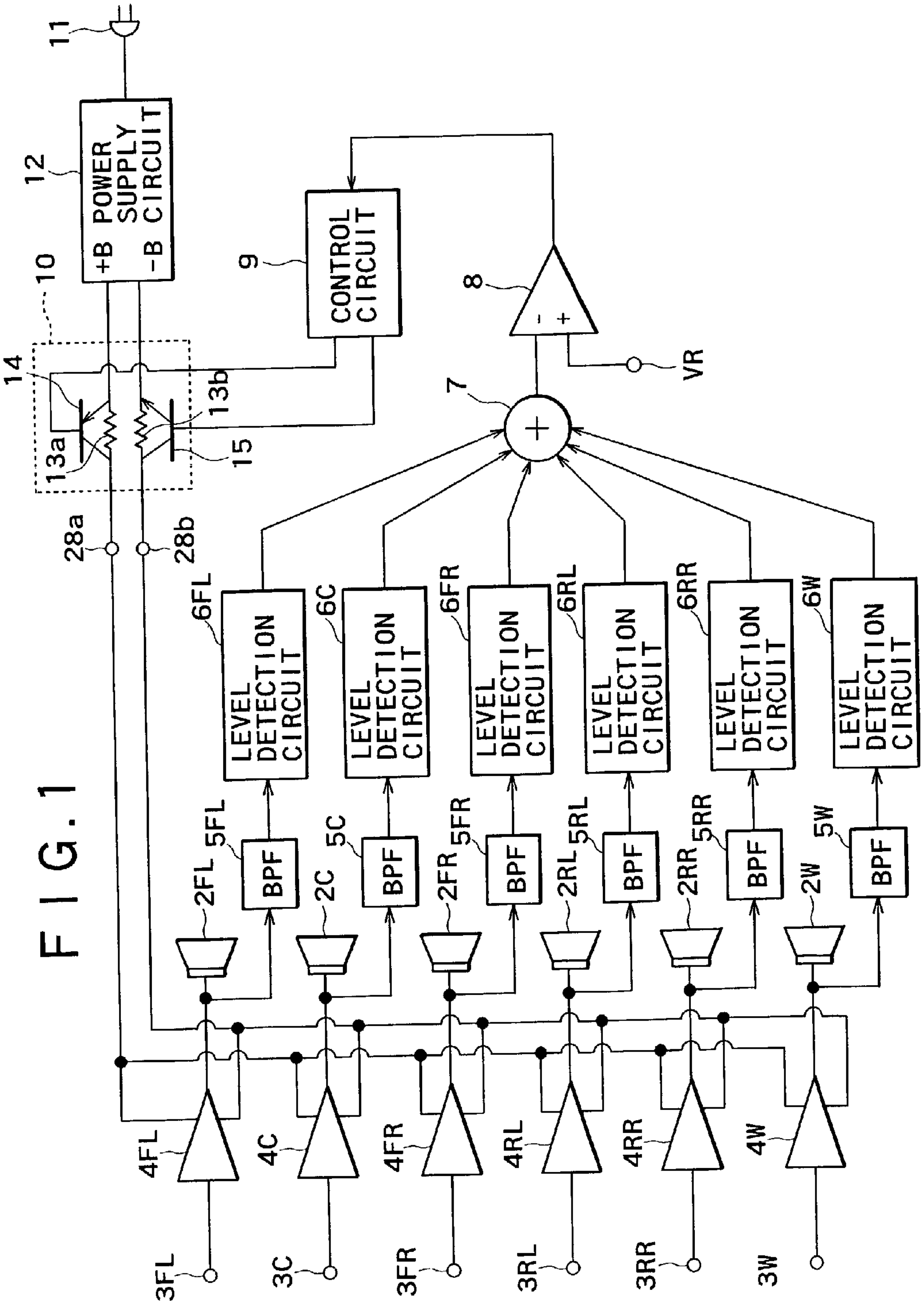
FIG. 1 is a block diagram showing an embodiment of a sound signal reproducing apparatus according to the present invention.

In FIG. 1, 3FL denotes a front left sound signal input terminal supplied with a front left sound signal for a home AV theater system from for example a DVD player or the like; 3C denotes a center sound signal input terminal supplied with a center sound signal for the home AV theater system; and 3FR denotes a front right sound signal input terminal supplied with a front right sound signal for the home AV theater system.

In FIG. 1, 3RL denotes a rear left sound signal input terminal supplied with a rear left sound signal: 3RR denotes a rear right sound signal input terminal supplied with a rear right sound signal; and 3W denotes a low-frequency sound signal input terminal supplied with a low-frequency sound signal of 200 Hz and lower, for example.

Figure 5:
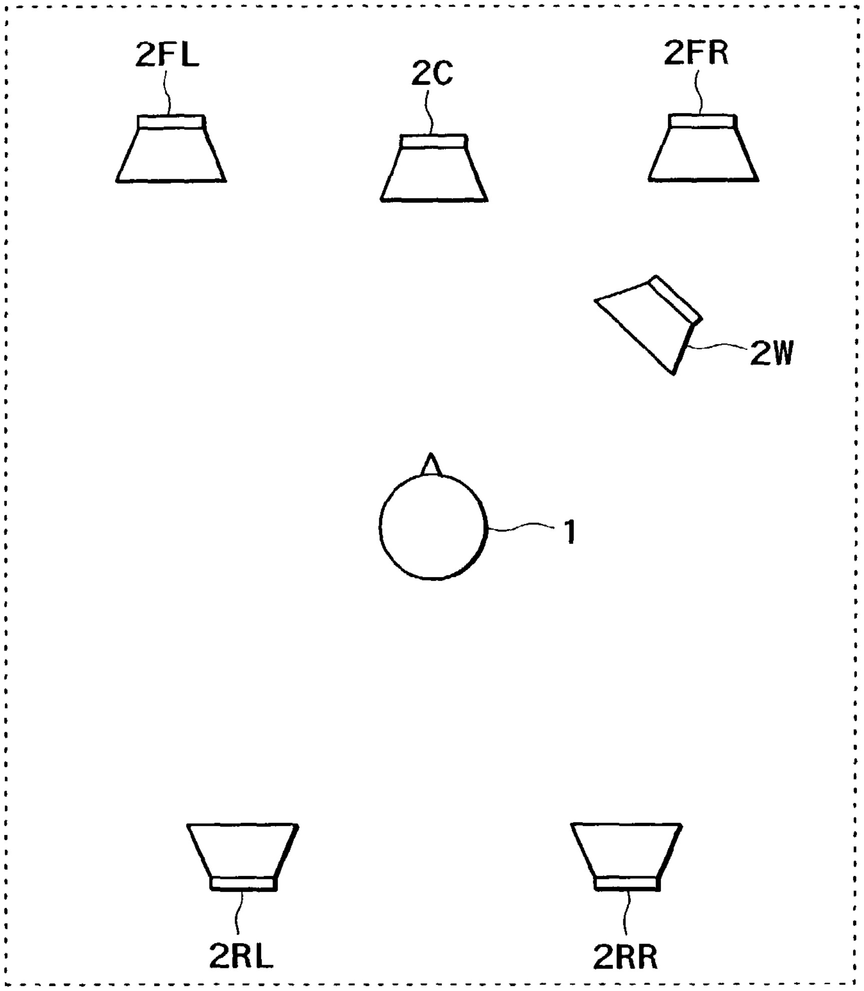
FIG. 5 is a diagram showing an example of arrangement of speakers.

The front left sound signal supplied to the front left sound signal input terminal 3FL is supplied to a front left speaker 2FL disposed as shown in FIG. 5 via a sound amplifier circuit 4FL. In the present embodiment, the front left sound signal obtained on the output side of the sound amplifier circuit 4FL is supplied to a level detection circuit 6FL via a band-pass filter 5FL for passing a signal of frequencies around the lowest impedance of the front left speaker 2FL, for example frequencies around 500 Hz. A detection signal of the level detection circuit 6FL is supplied to an adder circuit 7.

The center sound signal supplied to the center sound signal input terminal 3C is supplied to a center speaker 2C disposed as shown in FIG. 5 via a sound amplifier circuit 4C. In the present embodiment, the center sound signal obtained on the output side of the sound amplifier circuit 4C is supplied to a level detection circuit 6C via a band-pass filter 5C for passing a signal of frequencies around the lowest impedance of the center speaker 2C, for example frequencies around 500 Hz. A detection signal of the level detection circuit 6C is supplied to the adder circuit 7.

The front right sound signal supplied to the front right sound signal input terminal 3FR is supplied to a front right speaker 2FR disposed as shown in FIG. 5 via a sound amplifier circuit 4FR. In the present embodiment, the front right sound signal obtained on the output side of the sound amplifier circuit 4FR is supplied to a level detection circuit 6FR via a band-pass filter 5FR for passing a signal of frequencies around the lowest impedance of the front right speaker 2FR, for example frequencies around 500 Hz. A detection signal of the level detection circuit 6FR is supplied to the adder circuit 7.

The rear left sound signal supplied to the rear left sound signal input terminal 3RL is supplied to a rear left speaker 2RL disposed as shown in FIG. 5 via a sound amplifier circuit 4RL. In the present embodiment, the rear left sound signal obtained on the output side of the sound amplifier circuit 4RL is supplied to a level detection circuit 6RL via a band-pass filter 5RL for passing a signal of frequencies around the lowest impedance of the rear left speaker 2RL, for example frequencies around 500 Hz. A detection signal of the level detection circuit 6RL is supplied to the adder circuit 7.

The rear right sound signal supplied to the rear right sound signal input terminal 3RR is supplied to a rear right speaker 2RR disposed as shown in FIG. 5 via a sound amplifier circuit 4RR. In the present embodiment, the rear right sound signal obtained on the output side of the sound amplifier circuit 4RR is supplied to a level detection circuit 6RR via a band-pass filter 5RR for passing a signal of frequencies around the lowest impedance of the rear right speaker 2RR, for example frequencies around 500 Hz. A detection signal of the level detection circuit 6RR is supplied to the adder circuit 7.

The low-frequency sound signal supplied to the low-frequency sound signal input terminal 3W is supplied to a subwoofer 2W disposed as shown in FIG. 5 via a sound amplifier circuit 4W. In the present embodiment, the low-frequency sound signal obtained on the output side of the sound amplifier circuit 4W is supplied to a level detection circuit 6W via a band-pass filter 5W for passing a signal of frequencies around the lowest impedance of the subwoofer 2W, for example frequencies around 150 Hz. A detection signal of the level detection circuit 6W is supplied to the adder circuit 7.

A dynamic speaker used in general has a characteristic in that impedance of the dynamic speaker is lowered at a frequency somewhat higher than a low resonance frequency of the dynamic speaker. In the case where a reproduced signal is supplied from the sound amplifier circuit 4 to the speaker 2, even when a signal at the same voltage level is supplied at each frequency, more current flows to the speaker in a band of low speaker impedance. That is, the sound amplifier circuit supplies the speaker with more power in that band, and the power is supplied from a power supply circuit 12. For the above reason, the present embodiment is configured to monitor a sound signal in a band including a frequency at which the impedance of the speaker is the lowest.

Figure 2:
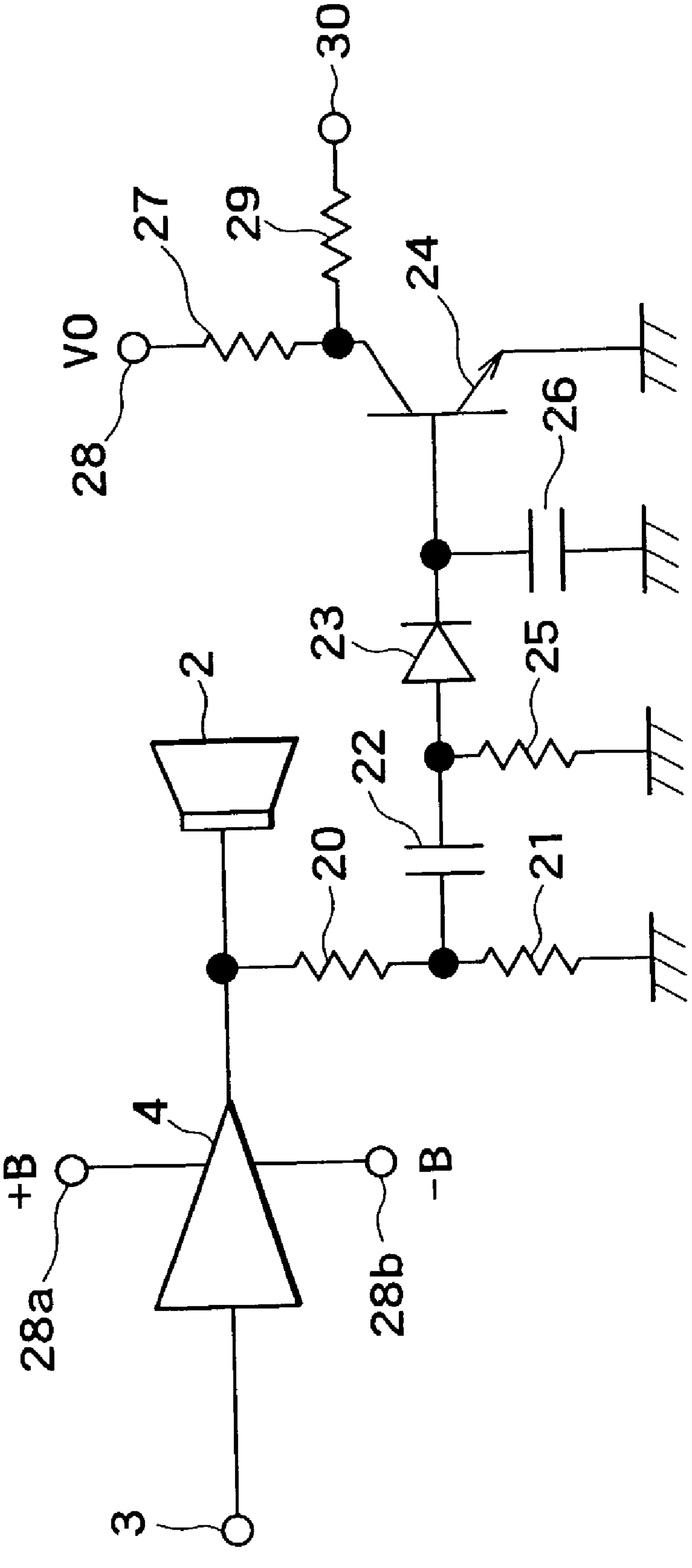
FIG. 2 is a connection diagram showing an example of a band-pass filter and a level detection circuit.

With the band-pass filters 5FL, 5C, 5FR, 5RL, 5RR, and 5W and the level detection circuits 6FL, 6C, 6FR, 6RL, 6RR, and 6W in the present embodiment, as shown for example in FIG. 2, a detection signal is obtained when level of the sound signal supplied to the band-pass filter and the input side of the level detection circuit exceeds a predetermined level, for example a permissible maximum level.

Description will now be made with reference to FIG. 2. In FIG. 2, reference numeral 3 denotes a sound signal input terminal. A sound signal supplied to the sound signal input terminal 3 is supplied to a speaker 2 via a sound amplifier circuit 4. One power supply terminal of the sound amplifier circuit 4 is connected to a power supply terminal 28*a* supplied with a positive direct-current voltage +B, for example a voltage of 15V, while another power supply terminal of the sound amplifier circuit 4 is connected to a power supply terminal 28*b* supplied with a negative direct-current voltage −B, for example a voltage of −15V.

The output side of the sound amplifier circuit 4 is grounded via a series circuit of resistors 20 and 21. A point of connection between the resistors 20 and 21 is connected to a base of an npn-type transistor 24 via a series circuit of a capacitor 22 and a diode 23. An intermediate point of connection between the capacitor 22 and an anode of the diode 23 is grounded via a resistor 25. A point of connection between a cathode of the diode 23 and the base of the transistor 24 is grounded via a capacitor 26.

An emitter of the transistor 24 is grounded. A collector of the transistor 24 is connected to a power supply terminal 28 supplied with a direct-current power having a voltage value of V0 via a resistor 27 having a resistance value of R1. The collector of the transistor 24 is also connected to an output terminal 30 via a resistor 29 having a resistance value of R2.

In this case, the resistors 20, 21, and 25, the capacitors 22 and 26, and the diode 23 form a band-pass filter having a center frequency in a region of frequencies where speaker impedance is the lowest, for example a center frequency of 500 Hz. The band-pass filter is configured such that a base voltage of the transistor 24 becomes 0.6 V, for example, which turns on the transistor 24, when level of a sound signal in the region of frequencies where speaker impedance is the lowest is a predetermined level, for example a permissible maximum level.

When the levels of sound signals supplied to the speakers 2FL, 2C, 2FR, 2RL, 2RR, and 2W are not at the predetermined level, a detection signal I obtained at the output terminal 30 of each of the level detection circuits 6FL, 6C, 6FR, 6RL, 6RR, and 6W is $$I=V0/(R1+R2)$$

In this case, a detection signal of a current of 6I is supplied to the adder circuit 7.

When the levels of sound signals supplied to the speakers 2FL, 2C, 2FR, 2RL, 2RR, and 2W have reached the predetermined level, for example the permissible maximum level, the transistor 24 is turned on, and a detection signal I obtained at the output terminal 30 of each of the level detection circuits 6FL, 6C, 6FR, 6RL, 6RR, and 6W is $$I=0$$

In this case, when the level of one of the output signals of the sound amplifier circuits 4FL, 4C, 4FR, 4RL, 4RR, and 4W exceeds the predetermined level, for example the permissible maximum level in one of the six channels, a detection signal supplied to the adder circuit 7 is 5I. When the predetermined level, for example the permissible maximum level is exceeded in two channels, a detection signal supplied to the adder circuit 7 is 4I. When the predetermined level, for example the permissible maximum level is exceeded in three channels, a detection signal supplied to the adder circuit 7 is 3I.

An addition voltage corresponding to the addition value of the detection signal obtained on the output side of the adder circuit 7 is supplied to an inverting input terminal − of an operational amplifier circuit 8 forming a comparator circuit. A value somewhat larger than a value of the addition voltage corresponding to the addition value of the detection signal obtained on the output side of the adder circuit 7 when the levels of three of the output signals of the sound amplifier circuits 4FL, 4C, 4FR, 4RL, 4RR, and 4W exceed the predetermined level, for example the permissible maximum level in three of the six channels, for example, is supplied as a reference voltage VR to a non-inverting input terminal + of the operational amplifier circuit 8.

An output signal of the comparator circuit 8 is supplied to a control circuit 9. An output signal of the control circuit 9 controls a power supply voltage control circuit 10 for controlling power supply voltage, which will be described later.

Reference numeral 11 in FIG. 1 denotes a power supply plug supplied with a commercial power. The commercial power supplied to the power supply plug 11 is supplied to a power supply circuit 12 for providing a positive direct-current voltage +B and a negative direct-current voltage −B. The positive direct-current voltage +B obtained in the power supply circuit 12 is supplied to the power supply terminal 28*a* via a limiting resistor 13*a* forming the power supply voltage control circuit 10. The negative direct-current voltage −B obtained in the power supply circuit 12 is supplied to the power supply terminal 28*b* via a limiting resistor 13*b* forming the power supply voltage control circuit 10.

In the present embodiment, a point of connection between an output terminal for the positive direct-current voltage +B of the power supply circuit 12 and the resistor 13*a* is connected to an emitter of a pnp-type transistor 14 forming the power supply voltage control circuit 10. A collector of the transistor 14 is connected to a point of connection between the resistor 13*a* and the power supply terminal 28*a*. A base of the transistor 14 is supplied with one control signal of the control circuit 9.

In the present embodiment, a point of connection between an output terminal for the negative direct-current voltage −B of the power supply circuit 12 and the resistor 13*b* is connected to an emitter of an npn-type transistor 15 forming the power supply voltage control circuit 10. A collector of the transistor 15 is connected to a point of connection between the resistor 13*b* and the power supply terminal 28*b*. A base of the transistor 15 is supplied with another control signal of the control circuit 9.

In this case, the transistors 14 and 15 in the power supply voltage control circuit 10 are both turned on in a normal state. In an abnormal state, the transistors 14 and 15 are both turned off, whereby the positive and negative power supply voltages +B and −B supplied to the power supply terminals 28*a* and 28*b* are controlled by the resistors 13*a* and 13*b*, respectively.

Figure 3:
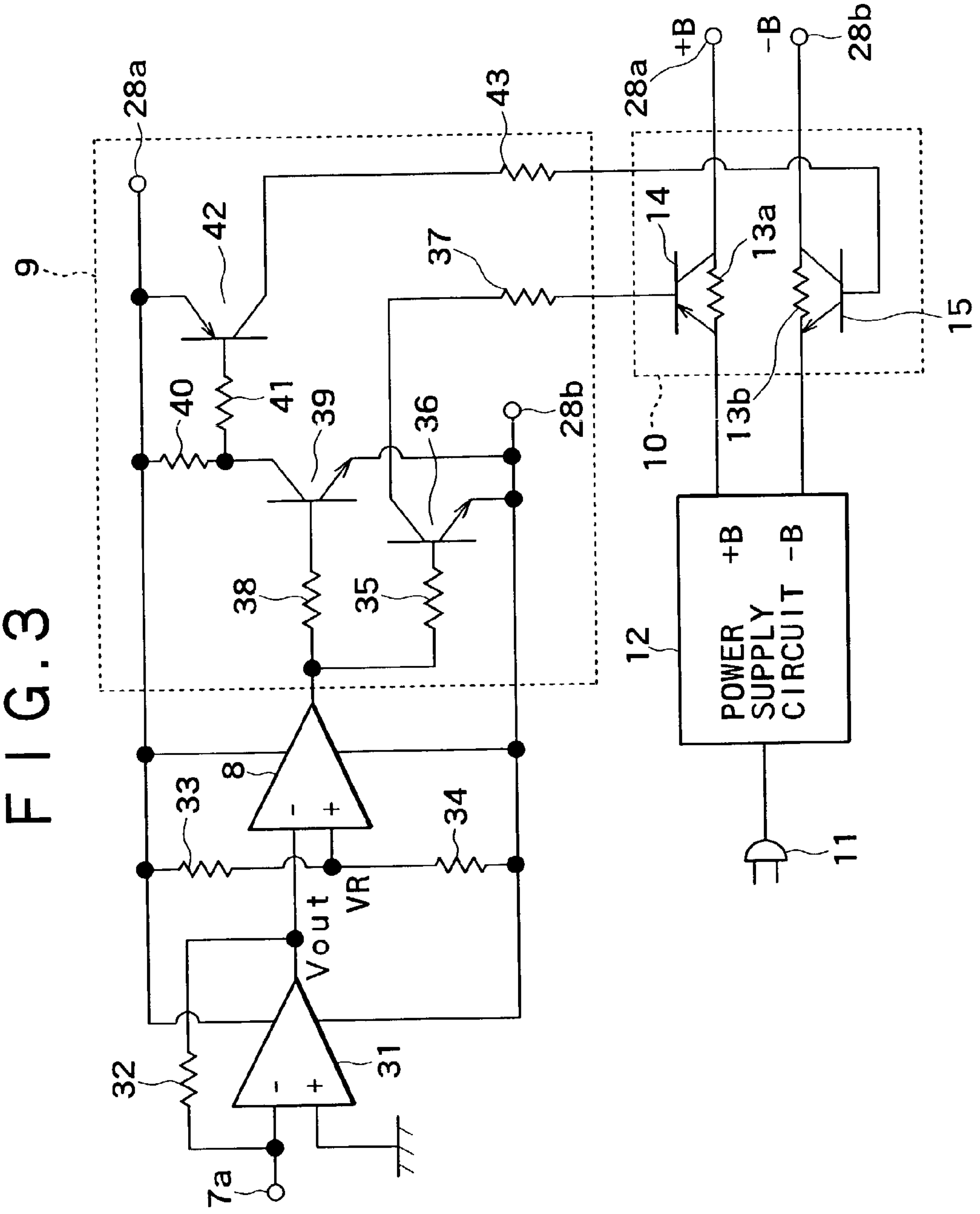
FIG. 3 is a connection diagram showing a concrete example of a main part in FIG. 1.

A concrete circuit example of the adder circuit 7, the comparator circuit 8, and the control circuit 9 is shown in FIG. 3. Making description with reference to FIG. 3, reference numeral 31 in FIG. 3 denotes an operational amplifier circuit forming the adder circuit 7. An input terminal 7*a* connected to an inverting input terminal − of the operational amplifier circuit 31 is supplied with the detection signals of the level detection circuits 6FL, 6C, 6FR, 6RL, 6RR, and 6W in the six channels.

A non-inverting input terminal + of the operational amplifier circuit 31 is grounded. An output terminal of the operational amplifier circuit 31 is connected to the inverting input terminal − of the operational amplifier circuit 31 via a feedback resistor 32 having a resistance value of R3. In this case, the number of channels in each of which the sound amplifier circuit 4FL, 4C, 4FR, 4RL, 4RR, or 4W has an output level exceeding the predetermined level, for example the permissible maximum level can be made to correspond to a voltage value within a range of power supply voltage of the operational amplifier circuit 31.

In this case, when the level of three of the output levels of the sound amplifier circuits 4FL, 4C, 4FR, 4RL, 4RR, and 4W in the six channels exceeds the predetermined level, for example the permissible maximum level, an output voltage Vout of the operational amplifier circuit 31 is $$Vout=3\times I\times R3$$

In a normal state, the output voltage Vout of the operational amplifier circuit 31 is $$Vout=6\times I\times R3$$

The output voltage Vout of the operational amplifier circuit 31 is obtained in a similar manner in other cases.

The output signal of the operational amplifier circuit 31 is supplied to the inverting input terminal − of the operational amplifier circuit 8 forming the comparator circuit. A series circuit of resistors 33 and 34 is connected between the positive power supply terminal 28*a* and the negative power supply terminal 28*b*. The reference voltage VR is obtained at a point of connection between the resistors 33 and 34. The reference voltage VR is supplied to the non-inverting input terminal + of the operational amplifier circuit 8.

An output terminal of the operational amplifier circuit 8 is connected to a base of an npn-type transistor 36 via a resistor 35. A collector of the transistor 36 is connected to the base of the transistor 14 in the power supply voltage control circuit 10 via a resistor 37. An emitter of the transistor 36 is connected to the negative power supply terminal 28*b*.

The output terminal of the operational amplifier circuit 8 is also connected to a base of an npn-type transistor 39 via a resistor 38. An emitter of the transistor 39 is connected to the negative power supply terminal 28*b*. A collector of the transistor 39 is connected to the positive power supply terminal 28*a* via a resistor 40. The collector of the transistor 39 is also connected to a base of a pnp-type transistor 42 via a resistor 41. An emitter of the transistor 42 is connected to the positive power supply terminal 28*a*. A collector of the transistor 42 is connected via a resistor 43 to the base of the transistor 15 forming the power supply voltage control circuit 10.

In this case, the reference voltage VR in the present embodiment is set somewhat larger than the value of the addition voltage corresponding to the addition value of the detection signal obtained on the output side of the adder circuit 7 when the predetermined level, for example the permissible maximum level is exceeded in three channels. Therefore, in the present embodiment, in a normal state and in cases where the predetermined level, for example the permissible maximum level is exceeded in up to two channels, the output side of the operational amplifier circuit 8 is at a high level. Thus, the transistors 36, 39, and 42 are each turned on and therefore the transistors 14 and 15 in the power supply voltage control circuit 10 are each turned on, so that the predetermined positive and negative direct-current voltages +B and −B are supplied to the positive and negative power supply terminals 28*a* and 28*b*, respectively.

Incidentally, while in FIG. 3, the power to the adder circuit 7, the comparator circuit 8, and the control circuit 9 is the same as that supplied to the sound amplifier circuit 4, the power may be the output voltages +B and −B of the power supply circuit 12 or another power supply voltage derived from a part of the power supply circuit 12 may be used.

In the present embodiment, when the output levels of three channels' sound amplifier circuits exceed the predetermined level, for example the permissible maximum level, the voltage corresponding to the detection signal which voltage is supplied to the inverting input terminal − of the operational amplifier circuit 8 is lower than the reference voltage VR supplied to the non-inverting input terminal + of the operational amplifier circuit 8. Therefore, the output side of the operational amplifier circuit 8 is at a low level and the transistors 36 and 39 are turned off. Thus, the transistor 42 is also turned off, and accordingly the transistors 14 and 15 in the power supply voltage control circuit 10 are each turned off, whereby the positive and negative direct-current voltages +B and −B supplied to the positive and negative power supply terminals 28*a* and 28*b* are limited by the resistors 13*a* and 13*b*, respectively.

As described above, the sound signal reproducing apparatus according to the present embodiment includes: the band-pass filters 5FL, 5C, 5FR, 5RL, 5RR, and 5W for passing a signal of frequencies around the lowest speaker impedance of the output signal of each of the sound amplifier circuits 4FL, 4C, 4FR, 4RL, 4RR, and 4W in the six channels, for example; the adder circuit 7 for adding the detection signals of each of the level detection circuits 6FL, 6C, 6FR, 6RL, 6RR, and 6W for detecting the level of output signals of each of the band-pass filters 5FL, 5C, 5FR, 5RL, 5RR, and 5W; and the comparator circuit 8 for comparing the output signal of the adder circuit 7 with the reference voltage VR, so that the output signal of the comparator circuit 8 controls the power supply voltages +B and −B to the sound amplifier circuits 4FL, 4C, 4FR, 4RL, 4RR, and 4W. Therefore, even when a state of the permissible maximum level continues in a plurality of channels, for example three channels, which is not normally expected, the power supply voltages +B and −B to the sound amplifier circuits 4FL, 4C, 4FR, 4RL, 4RR, and 4W are limited. Thus, the sound signal reproducing apparatus does not break down even when the power supply circuit 12 is made relatively small in size.

It is to be noted that while in the embodiment described above, the resistors and shunt transistors are used as the power supply voltage control circuit 10, relay switches or the like may be used in place of the transistors. Also, the power supply circuit 12 may be controlled to change the output voltage thereof according to the output signal of the adder circuit 7.

Moreover, while in the embodiment described above, both the positive and negative power supply voltages +B and −B to the sound amplifier circuits 4FL, 4C, 4FR, 4RL, 4RR, and 4W are limited, either one of the power supply voltages +B and −B may of course be limited. The present invention is of course applicable to a sound amplifier circuit using only either a positive power supply voltage or a negative power supply voltage.

Figure 4:
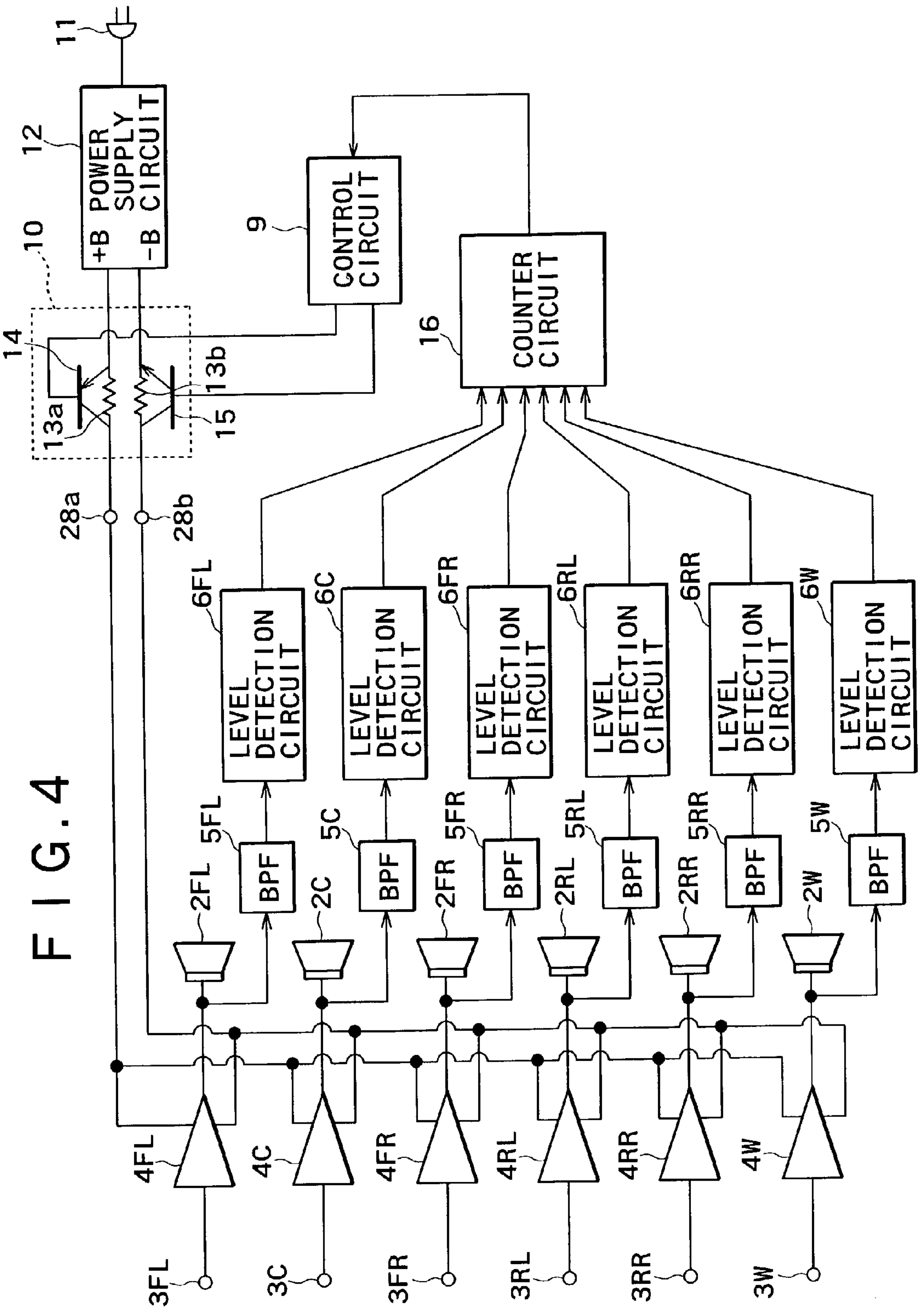
FIG. 4 is a block diagram showing another embodiment of a sound signal reproducing apparatus according to the present invention.

Furthermore, while in the embodiment described above, either of two states in which the output signal of the adder circuit 7 is higher and lower than the reference voltage VR is detected to change the power supply voltage supplied to the sound amplifier circuit 4, two or more such reference voltages may be provided to change the power supply voltage supplied to the sound amplifier circuit 4 to three values or more. In addition, since the level detection circuit 6 indicates an "H" or an "L" according to whether the output level of the sound amplifier circuit 4 exceeds a threshold value, instead of providing the adder circuit 7 and the comparator circuit 8 succeeding the level detection circuit 6, the number of channels where the output of the level detection circuit 6 indicates the "H" or the "L" may be counted by a counter circuit 16 as shown in FIG. 4 to control the power supply voltage control circuit 10 according to the number of channels counted. Also in this case, a plurality of channel counts each serving as a threshold value may of course be provided.

It is to be noted that while in the embodiment described above, the band-pass filter 5 for extracting a sound signal in a band including a frequency at which the impedance of the speaker is the lowest from a sound signal supplied to the speaker is provided, instead of providing the band-pass filter 5, the level detection circuit may simply detect the level of the output sound signal. The level detection circuit may be a circuit for detecting an effective value in a predetermined integral time or a peak value, as well as an average value detecting circuit as in the embodiment described above.

Also, the present invention is not limited to the embodiment described above, and may of course employ various other configurations without departing from the spirit of the present invention.

The present invention has advantages of making it possible to make the power supply circuit relatively small and preventing the sound signal reproducing apparatus from breaking down even when a state of a maximum output continues in a plurality of channels, which is not normally expected.

While the preferred embodiments of the present invention have been described using the specific terms, such description is for illustrative purposes only, and it is to be understood that changes and variations may be made without departing from the spirit or scope of the following claims.

What is claimed is:

1. A sound signal reproducing apparatus comprising:

a plurality of sound amplifier circuits for amplifying respective sound signals inputted thereto and for supplying amplified sound signals to a plurality of speakers;

a plurality of level detection circuits for detecting respective levels of the amplified sound signals output by said plurality of sound amplifier circuits and for outputting a signal therefrom, each of said plurality of level detection circuits corresponds to a respective sound amplifier circuit among said plurality of sound amplifier circuits;

an adder circuit for adding each output signal of said plurality of level detection circuits so as to form a detection signal, said detection signal represents a summed value of the amplified sound signals; and power supply voltage control means for controlling a power supply voltage supplied to each of said plurality of sound amplifier circuits based on the detection signal of said adder circuit.

2. The sound signal reproducing apparatus as claimed in claim 1, wherein said power supply voltage control means includes a comparator circuit for comparing the output signal of said adder circuit with a reference level; and said power supply voltage control means controls the power supply voltage supplied to said plurality of sound amplifier circuits based on an output signal of said comparator circuit.

3. The sound signal reproducing apparatus as claimed in claim 2, wherein the reference level compared by said comparator circuit is selected from a plurality of different levels; and the power supply voltage supplied to said sound amplifier circuits is set to correspond to the selected level of the plurality of different levels.

4. The sound signal reproducing apparatus as claimed in claim 1, wherein each of said plurality of level detection circuits has a filter circuit for extracting a signal in a predetermined frequency band from the output signal of each of said plurality of sound amplifier circuits; and each of said plurality of level detection circuit detects a level of an output signal of each said filter circuit for output.

5. The sound signal reproducing apparatus as claimed in claim 4, wherein said predetermined frequency band extracted by said filter circuit is a frequency band having a center frequency in a range of frequencies where impedance of said speaker is a lowest.

6. The sound signal reproducing apparatus as claimed in claim 1, wherein control of the power supply voltage by said power supply voltage control means is effected by a parallel circuit of a resistor and a shunt transistor inserted between a power supply circuit for supplying the power supply voltage to said plurality of sound amplifier circuits.

7. The sound signal reproducing apparatus as claimed in claim 1, wherein said power supply voltage control means effects control so as to change an output voltage of a power supply circuit supplying the power supply voltage to said plurality of sound amplifier circuits.

8. A sound signal reproducing apparatus comprising:

a plurality of sound amplifier circuits for amplifying sound signals inputted thereto and for supplying amplified sound signals to a plurality of speakers;

a plurality of level detection circuits, each level detection circuit being operable to output a detection signal based on a comparison between the a level of an amplified sound signal output from a sound amplifier circuit corresponding to the respective level detection circuit and a predetermined value;

a counter circuit for counting a number of the level detection circuits that output a detection signal; and power supply voltage control means for controlling a power supply voltage supplied to said plurality of sound amplifier circuits according to the number counted by the counting circuit.

9. The sound signal reproducing apparatus as claimed in claim 8, wherein said power supply voltage control means changes the power supply voltage supplied to said plurality of sound amplifier circuits when the number counted by said counter circuit exceeds a predetermined reference value.

10. The sound signal reproducing apparatus as claimed in claim 9, wherein the reference value compared by said counter circuit is selected from a plurality of different values; and the power supply voltage supplied to said sound amplifier circuits is set so as to correspond to the selected one of the plurality of different values.

11. The sound signal reproducing apparatus as claimed in claim 8, wherein each of said level detection circuits includes a filter circuit for extracting a signal in a predetermined frequency band from a respective output signal of said plurality of sound amplifier circuits; and said level detection circuit outputs the detection signal when the level of the output signal of each said filter circuit exceeds a predetermined value.

12. The sound signal reproducing apparatus as claimed in claim 11, wherein said predetermined frequency band in said filter circuit is a frequency band having a center frequency in a range of frequencies where impedance of said plurality of speakers is lowest.

13. The sound signal reproducing apparatus as claimed in claim 8, wherein control of the power supply voltage by said power supply voltage control means is effected by a parallel circuit of a resistor and a shunt transistor inserted between a power supply circuit and said plurality of sound amplifier circuits.

14. The sound signal reproducing apparatus as claimed in claim 8, wherein said power supply voltage control means effects control to change an output voltage of a power supply circuit.

* * * * *

UNITED STATES PATENT AND TRADEMARK OFFICE

CERTIFICATE OF CORRECTION

PATENT NO. : 7,110,555 B2
APPLICATION NO. : 10/208473
DATED : September 19, 2006
INVENTOR(S) : Hideaki Shiobara It is certified that error appears in the above-identified patent and that said Letters Patent is hereby corrected as shown below:

In Column 9, Line 22, “to” should read --and--
In Column 9, Line 36, delete “the”

Signed and Sealed this

Fifth Day of June, 2007

JON W. DUDAS
*Director of the United States Patent and Trademark Office*